(12) United States Patent
Ohkura (10) Patent No.: US 7,388,198 B2
(45) Date of Patent: Jun. 17, 2008

(54) ELECTRON MICROSCOPE

(75) Inventor: Yoshihiro Ohkura, Tokyo (JP)

(73) Assignee: Jeol Ltd., Tokyo (JP)

( * ) Notice: Subject to any disclaimer, the term of this patent is extended or adjusted under 35 U.S.C. 154(b) by 309 days.

(21) Appl. No.: 11/191,147

(22) Filed: Jul. 27, 2005

(65) Prior Publication Data

US 2006/0022137 A1  Feb. 2, 2006

(30) Foreign Application Priority Data

Jul. 29, 2004  (JP) .............................. 2004-221278

(51) Int. Cl.
*G21K 7/00* (2006.01)
(52) U.S. Cl. .............. 250/305; 250/306; 250/310; 250/311; 250/396 R; 250/397
(58) Field of Classification Search .............. 250/310, 250/311, 305, 396 R, 306, 397
See application file for complete search history.

(56) References Cited

U.S. PATENT DOCUMENTS

| | | | | |
|---|---|---|---|---|
| 4,608,491 A | * | 8/1986 | Kokubo | 250/311 |
| 5,798,524 A | * | 8/1998 | Kundmann et al. | 250/305 |
| 5,923,034 A | * | 7/1999 | Ogasawara et al. | 250/311 |
| 5,986,269 A | * | 11/1999 | Krijn et al. | 250/396 R |
| 6,097,028 A | * | 8/2000 | Tsuno | 250/305 |
| 6,150,657 A | * | 11/2000 | Kimoto et al. | 250/305 |
| 6,323,485 B1 | * | 11/2001 | Tsuno | 250/311 |
| 6,410,924 B1 | * | 6/2002 | Wang | 250/398 |
| 6,720,558 B2 | * | 4/2004 | Kaneyama | 250/311 |
| 6,770,878 B2 | * | 8/2004 | Uhlemann et al. | 250/305 |
| 6,822,233 B2 | * | 11/2004 | Nakamura et al. | 250/311 |
| 6,930,306 B2 | * | 8/2005 | Kaji et al. | 250/305 |

FOREIGN PATENT DOCUMENTS

JP  2001-076664  3/2001

* cited by examiner

*Primary Examiner*—Jack I. Berman
*Assistant Examiner*—Michael J Logie
(74) *Attorney, Agent, or Firm*—The Webb Law Firm (57) ABSTRACT

An electron microscope capable of producing EELS (electron energy-loss spectroscopy) has a spectral position correcting signal supply circuit for supplying a spectral position correcting signal H to a first driver amplifier to project spectra at the center of a CCD camera. This correcting signal H corresponds to a beam deflection signal A' supplied from a scan generator to a second driver amplifier, an excitation signal B' supplied from an intermediate lens excitation signal supply circuit to a third driver amplifier, and another excitation signal supplied from a projector lens excitation signal supply circuit to a fourth driver amplifier.

8 Claims, 5 Drawing Sheets

ELECTRON MICROSCOPE

BACKGROUND OF THE INVENTION

1. Field of the Invention

The present invention relates to an electron microscope capable of analyzing the electronic state of a solid specimen by electron energy-loss spectroscopy (EELS).

2. Description of Related Art

When incident electrons collide against atoms constituting a solid specimen, some of the electrons interact with electrons within the specimen crystal or crystal lattice, lose part of their energy, and are scattered, that is, their velocity decreases. These scattered electrons are known as inelastically scattered electrons. A technique for analyzing the electronic state of a solid specimen by analyzing inelastically scattered electrons in terms of energy is known as electron energy-loss spectroscopy (EELS). On the other hand, when incident electrons collide against atoms constituting a solid specimen and scatter without losing energy, the electrons are termed elastically scattered electrons.

Figure 1A:
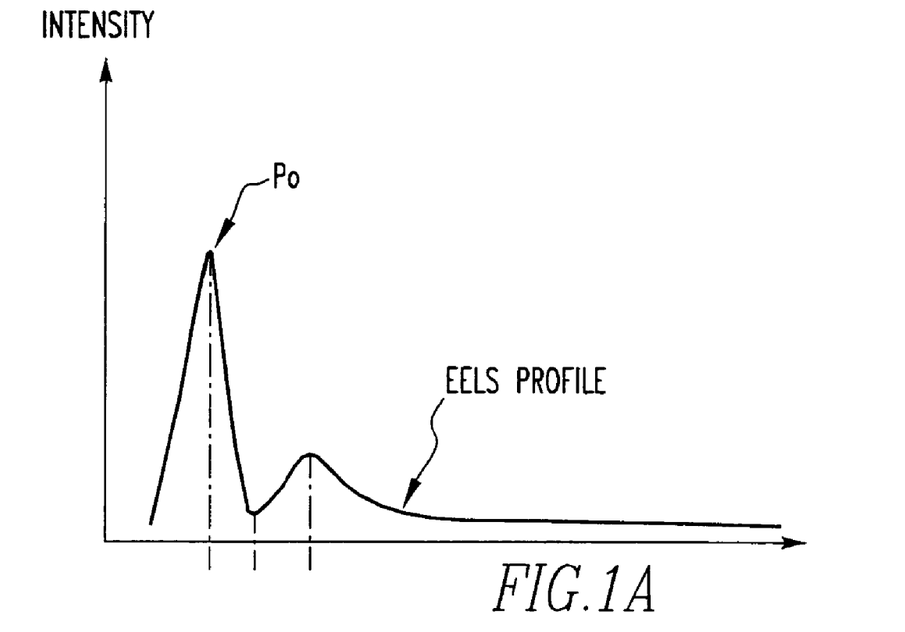
FIG. 1A is a diagram illustrating an EELS profile of the spectral image shown in FIG. 1B.

In the current electron microscopy, specimens are analyzed by the aforementioned EELS. FIG. 1A shows an EELS profile obtained by an EELS analysis. This profile has been obtained by image-processing a spectral image shown in FIG. 1B. This spectral image has been taken by a CCD camera disposed behind the projector lens. A method of gaining this spectral image shown in FIG. 1B is described below.

To obtain this spectral image, an electron microscope equipped with an energy filter (such as an Omega filter) behind a specimen is used. In this microscope having the energy filter, a sharply focused electron beam is directed at the specimen. As a result, electrons are ejected from the specimen. The ejected electrons are energy-dispersed in a given direction (i.e., direction substantially perpendicular to the direction in which electrons hit the specimen) by an energy filter. This energy-dispersed electron beam creates the spectrum shown in FIG. 1B between the energy filter and the projector lens. The spectrum is projected onto the CCD camera by the projector lens.

Figure 1B:
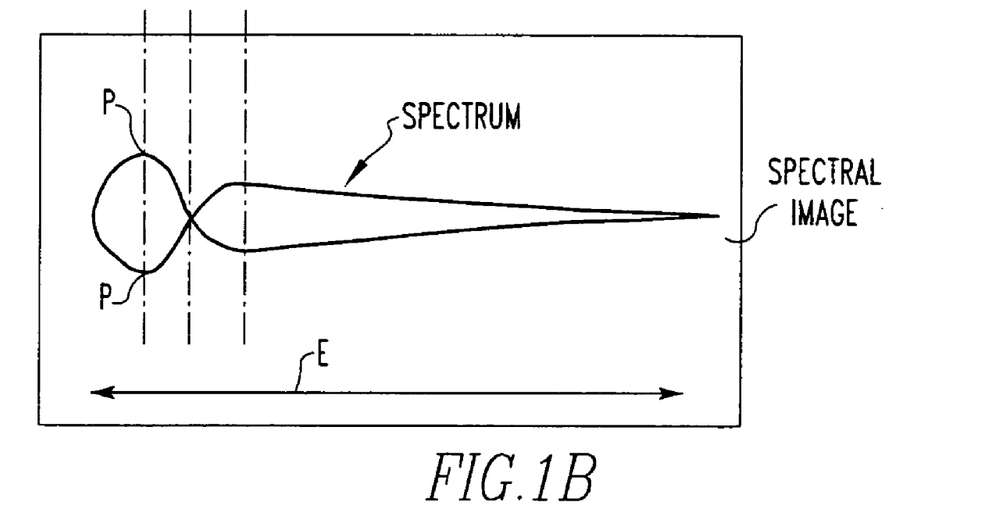

A method of gaining the spectral image shown in FIG. 1B has been described so far. The arrow E shown in the spectral image of FIG. 1B indicates the direction of energy dispersion. This direction E is coincident with the longitudinal direction of the spectrum.

The spectral image obtained in this way is converted into the EELS profile shown in FIG. 1A by an image processor. In particular, the processor accumulates the intensity of the obtained spectral image in a direction perpendicular to the direction of energy dispersion E. The intensity variation is plotted against the direction of energy dispersion, thus giving rise to an EELS profile (see Japanese Patent Laid-Open No. 2001-76664). A sharp peak $P_0$ appearing on the EELS profile shown in FIG. 1A is a zero-loss peak at which energy loss is zero. This zero-loss peak $P_0$ is produced by the aforementioned elastically scattered electrons.

Where some surface of a specimen is analyzed by EELS, the electron beam hitting the specimen is deflected in the x- and y-directions by deflectors. The specimen surface is scanned in two dimensions by the sharply focused beam. The aforementioned spectral image is obtained at each analysis point on the specimen irradiated with the beam. Hence, an EELS profile at each analysis point on the sample is obtained. The electronic state of some surface of the specimen can be analyzed from these EELS profiles.

However, this surface analysis using EELS produces the following problems: (1) When the electron beam scans over the specimen surface, the spectral position on the CCD camera is moved. The amount of movement of the spectrum is in proportion to the scanning width of the beam on the specimen surface. Where the electron beam is deflected to a great extent and a wide area of the specimen surface is scanned by the beam, the spectrum does not lie within the light-sensitive surface of the CCD camera. (2) Since the spectral position moves across the CCD camera as mentioned previously, the spectral positions within plural spectral images taken by the CCD camera are not fixed. Consequently, the EELS profile cannot be calibrated in the direction of energy dispersion unless the image position (position p in FIG. 1B) corresponding to the zero-loss peak $P_0$ is detected by an image recognition technique for every spectral image obtained at each analysis point. Since the image recognition processing is time-consuming, it has been heretofore difficult to display EELS profiles at high speed. (3) Where the spectral position moves across the CCD camera and the spectral part forming the zero-loss peak $P_0$ comes out of the light-sensitive surface of the camera as described above, it is impossible to determine the energy position of the EELS profile by the image recognition technique.

SUMMARY OF THE INVENTION

It is an object of the present invention to provide an electron microscope capable of obtaining EELS profiles irrespective of the electron beam position on the specimen.

An electron microscope of the present invention for achieving the above-described object comprises: an electron gun for emitting an electron beam; a condenser lens for focusing the beam onto a specimen; first deflection means for deflecting the beam hitting the specimen to vary electron beam position on the specimen; an energy filter for energy-dispersing the electron beam ejected from the specimen in a given direction to form a spectrum; and a projector lens for projecting the spectrum formed by the filter onto an image detector. This microscope is further equipped with second deflection means for deflecting the beam ejected from the specimen in such a way that the spectrum is kept projected onto the detector irrespective of the beam position on the specimen.

Accordingly, the present invention can provide an electron microscope capable of obtaining an EELS profile irrespective of the beam position on the specimen.

Other objects and features of the invention will appear in the course of the description thereof, which follows.

DESCRIPTION OF THE PREFERRED EMBODIMENTS

The preferred embodiments of the present invention are hereinafter described with reference to the accompanying drawings.

Figure 2:
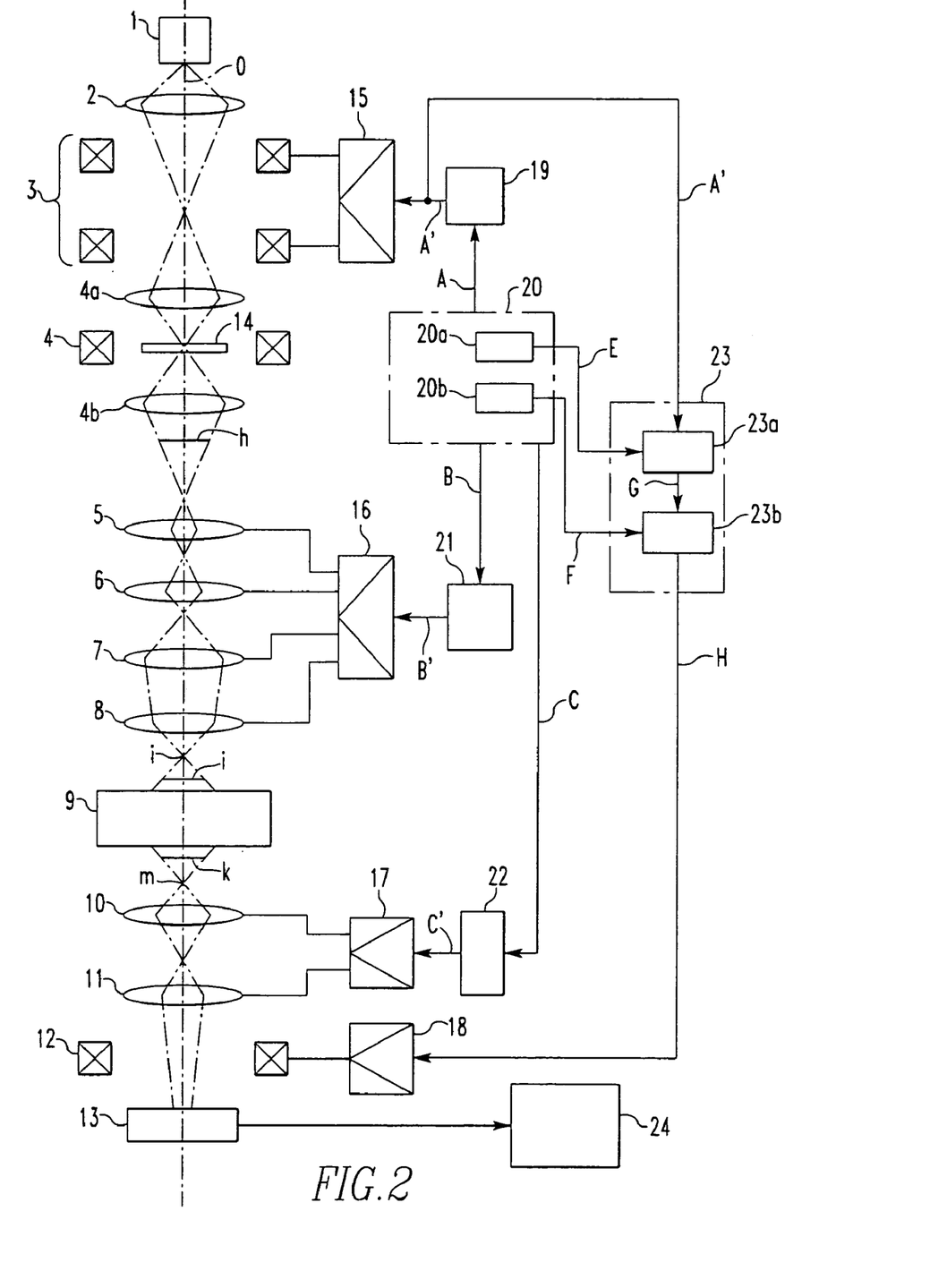
FIG. 2 is a block diagram of an electron microscope according to the present invention.

FIG. 2 shows a transmission electron microscope according to the present invention. The microscope has an electron gun 1. A condenser lens 2, two stages of scan coils (first deflector) 3, an objective lens 4, four stages of intermediate lenses 5-8, an Omega filter (energy filter) 9, two stages of projector lenses 10, 11, a deflection coil (second deflector) 12 for moving the spectral position, and a CCD camera (image detector) 13 are placed in this order from the gun side behind the gun 1. A specimen 14 is set on a specimen holder (not shown) and positioned between the front electric field 4a and rear electric field 4b of the objective lens 4.

Referring also to FIG. 2, there are shown an amplifier (drive power supply) 15 for driving the scan coils 3, an amplifier 16 for driving the intermediate lenses 5-8, an amplifier 17 for driving the projector lenses 10, 11, and an amplifier 18 for driving the deflection coil 12 for moving the spectral position. The driver amplifier 15 is electrically connected with a central controller 20 via a scan generator (deflection signal supply circuit) 19. The driver amplifier 16 is electrically connected with the central controller 20 via an intermediate lens excitation signal supply circuit 21. The driver amplifier 17 is electrically connected with the central controller 20 via a projector lens excitation signal supply circuit 22. The driver amplifier 18 is electrically connected with a spectral position correcting signal supply circuit 23.

The spectral position correcting signal supply circuit 23 has a scanning direction rotating circuit 23a and a scanning amplitude varying circuit 23b. The correcting signal supply circuit 23 is electrically connected with the central controller 20. The scan generator 19 produces an output signal to the scanning direction rotating circuit 23a of the spectral position correcting signal supply circuit 23.

Referring still to FIG. 2, the CCD camera 13 supplies an output signal to an image processor 24.

The instrumental configuration of the electron microscope shown in FIG. 2 has been described so far. The aforementioned scan coils 3, driver amplifier 15, scan generator 19, and central controller 20 together form the "first deflection means" referred to herein. The spectral position moving deflection coil 12, driver amplifier 18, spectral position correcting signal supply circuit 23, and central controller 20 together form the "second deflection means" referred to herein. The operation of the electron microscope shown in FIG. 2 is described below.

Where a surface of the specimen 14 is analyzed by EELS, an electron beam emitted by the electron gun 1 is sharply focused onto the specimen by the condenser lens 2 and the front field 4a of the objective lens.

To scan the focused beam over the specimen 14 in the x- and y-directions which are perpendicular to each other and to the optical axis O, the central controller 20 supplies a scan signal A to the scan generator 19. The generator 19 creates a scanning waveform signal (electron beam-deflecting signal) A' based on the scan signal A and supplies the created waveform signal A' to the driver amplifier 15. The driver amplifier 15 controls the electrical current flowing through the scan coils 3 based on the waveform signal A'. The electron beam is deflected in the x- and y-directions by the scan coils 3 controlled in this way. The analysis points on the specimen are successively irradiated with the sharply focused beam.

The electron beam ejected from the specimen 14 in response to the irradiation is focused by the rear field 4b of the objective lens. Diffraction patterns at the analysis points are formed in turn on the rear focal plane h of the objective lens 4. The intermediate lenses 5-8 magnify the diffraction patterns formed on the rear focal plane h and form the magnified diffraction patterns on the incident image plane j of the Omega filter 9. The central controller 20 supplies an excitation signal B to the intermediate lens excitation signal supply circuit 21 in controlling the intermediate lenses 5-8. The supply circuit 21 supplies an excitation signal B' corresponding to the excitation signal B to the driver amplifier 16, which in turn controls the excitation currents flowing through the intermediate lenses 5-8 based on the excitation signal B'.

In FIG. 2, an incident crossover point i is located between the final stage of intermediate lens 8 and the incident image plane j of the Omega filter 9. The beam focused on the specimen surface is focused at this crossover point i. As the beam is scanned over the specimen surface, the crossover point i moves in the x- and y-directions. The amount of movement is in proportion to the scanning width of the beam over the specimen surface.

The amount of movement of the incident crossover point i in the x- and y-directions when the beam is scanned is also varied by variation in the excitation of the intermediate lenses 5-8. That is, when the amount of excitation of the intermediate lenses 5-8 is varied to reduce the size of the diffraction pattern formed on the incident image plane j, the amount of movement of the crossover point i in the x- and y-directions during scanning is increased. Conversely, when the excitation of the intermediate lenses 5-8 is varied to increase the size of the diffraction pattern formed on the incident image plane j, the amount of movement of the crossover point i in the x- and y-directions during scanning is reduced. The diffraction pattern formed on the incident image plane j does not move in the x- or y-direction if the beam is scanned over the specimen surface.

The electron beam passed through the intermediate lenses 5-8 impinges on the Omega filter 9, which in turn energy-disperses the incident electron beam in a given direction (e.g., x-direction) substantially perpendicular to the incident direction (along the optical axis O) and focuses the beam onto an energy dispersive plane m (see FIG. 2). As a result, the spectrum (see FIG. 1B) is formed on the energy dispersive plane m. As the incident crossover point i moves in the x- and y-directions as described previously, the spectrum formed on the energy dispersive plane m moves in the x- and y-directions. That is, the spectrum formed on the energy dispersive plane m moves in the x- and y-directions as the electron beam is scanned over the specimen surface.

Usually, an energy-selecting baffle with slit (not shown) for passing only a certain energy of electrons is disposed on the energy dispersive plane m. Where a spectrum is obtained, the baffle with slit is retracted from the optical axis O or opened. In FIG. 2, the Omega filter 9 has an exit image plane k on which a diffraction pattern is formed.

The projector lenses 10 and 11 positioned behind the Omega filter 9 magnify the spectrum formed on the energy dispersive plane m and focus (project) the spectrum onto the light-sensitive surface of the CCD camera 13. The central controller 20 supplies an excitation signal C to the projector lens excitation signal supply circuit 22 in controlling the projector lenses 10 and 11. The supply circuit 22 supplies an excitation signal C' corresponding to the excitation signal C to the driver amplifier 17. The driver amplifier 17 controls the excitation current of the projector lenses 10 and 11 based on the excitation signal C'.

One feature of the present invention is that there is provided the deflection coil 12 for moving the spectral position. Movement of the spectrum across the CCD camera 13 when the deflection coil 12 is not operated is described next by referring to FIGS. 3A-6B. In each of FIGS. 3A-6B, (A) shows scanning of the electron beam over the specimen 14, and (B) shows movement of the spectrum on the CCD camera 13 caused by the scanning of the beam.

Figure 3A:
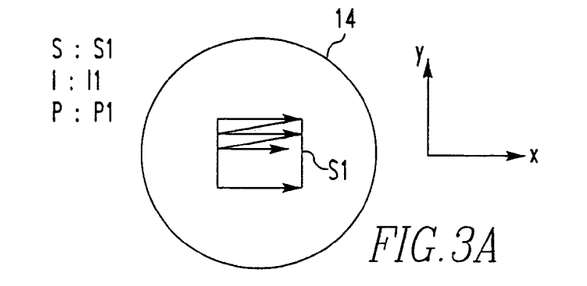
FIGS. 3A and 3B are diagrams illustrating motion of a spectrum on a CCD camera.
Figure 3B:
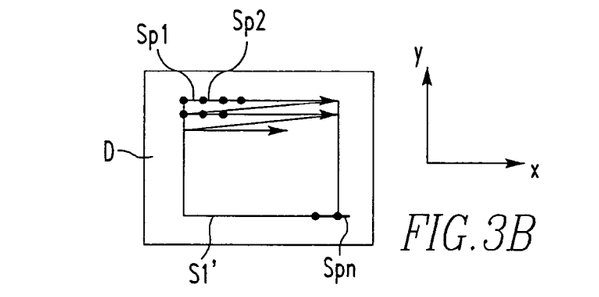

FIG. 3B shows movement of spectra ($Sp_1$, $Sp_2$, ..., $Sp_n$) on the light-sensitive surface D of the CCD camera 13 when the area S of the specimen 14 scanned with the electron beam is $S_1$ (FIG. 3A), the amount of excitation of the intermediate lenses 5-8 is $I_1$, and the amount of excitation P of the projector lenses 10, 11 is $P_1$. In this case, as shown in FIG. 3B, the area $S_1'$ on the CCD camera 13 scanned with the beam is totally within the light-sensitive surface D and so the spectra ($Sp_1$, $Sp_2$, ..., $Sp_n$) at all the analysis points can be imaged by the CCD camera 13. In this case, the direction of scanning of the electron beam on the CCD camera 13 is coincident with the horizontal direction (x-direction) of the light-sensitive surface D. However, the spectra ($Sp_1$, $Sp_2$, ..., $Sp_n$) move across the CCD camera 13. Consequently, it takes a long time to perform image recognition processing as described already.

Figure 4A:
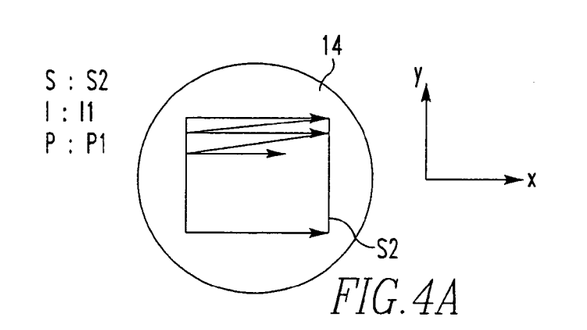
FIGS. 4A and 4B are diagrams illustrating motion of a spectrum on a CCD camera.
Figure 4B:
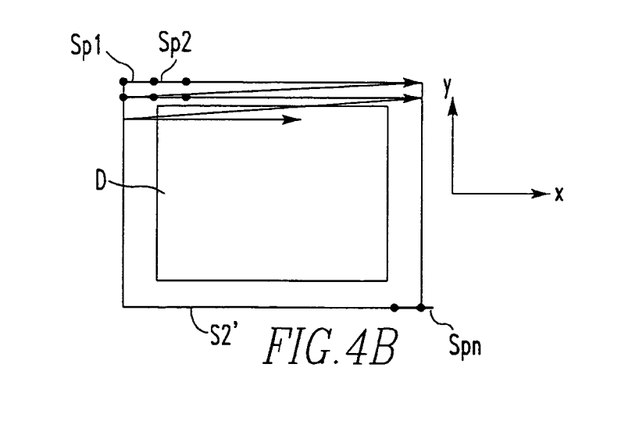

FIG. 4B shows movement of spectra ($Sp_1$, $Sp_2$, ..., $Sp_n$) on the light-sensitive surface D of the CCD camera 13 when the area S of the specimen 14 scanned with the electron beam is $S_2$ (FIG. 4A) greater than $S_1$ in FIG. 3A, the amount of excitation I of the intermediate lenses 5-8 is $I_1$ in the same way as in the case of FIG. 3A, and the amount of excitation P of the projector lenses 10, 11 is $P_1$ in the same way as in the case of FIG. 3A. In this case, as shown in FIG. 4B, the area $S_2'$ of the CCD camera 13 scanned with the beam is not placed fully within the light-sensitive surface D. Therefore, some spectra, such as $Sp_1$ and $Sp_2$, are not imaged by the CCD camera 13. Also, in this case, the direction of scanning of the beam on the CCD camera 13 is coincident with the horizontal direction (x-direction) of the sensitive surface D.

Figure 5A:
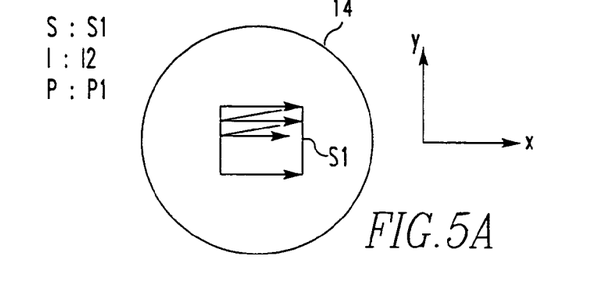
FIGS. 5A and 5B are diagrams illustrating motion of a spectrum on a CCD camera.
Figure 5B:
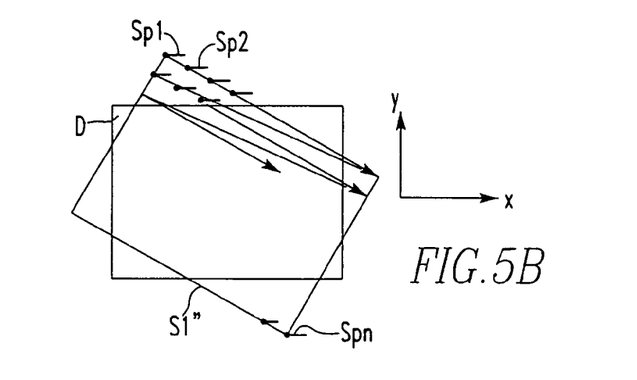

FIG. 5B shows movement of spectra ($Sp_1$, $Sp_2$, ..., $Sp_n$) on the light-sensitive surface D of the CCD camera 13 when the area S of the specimen 14 scanned with the electron beam is $S_1$ (see FIG. 5A) in the same way as in the case of FIG. 3A, the amount of excitation I of the intermediate lenses 5-8 is $I_2$ different from the amount of excitation in the case of FIG. 3A, and the amount of excitation P of the projector lenses 10, 11 is $P_1$ in the same way as in the case of FIG. 3A. The amount of excitation $I_2$ used at this time is intended to reduce the size of the diffraction pattern formed on the incident image plane j of FIG. 2 as compared with the size used in the case of FIG. 3A. That is, the amount of excitation $I_2$ is intended to increase the amount of movement of the incident crossover point i (see FIG. 2) in the x- and y-directions caused by scanning of the electron beam. Accordingly, in this case, the area $S_1''$ on the CCD camera 13 scanned with the beam is wider than in the case of FIG. 3A. The area $S_1''$ is not fully within the light-sensitive surface D. Therefore, some of the spectra, such as $Sp_1$ and $Sp_2$, are not imaged by the CCD camera 13. The scanned area $S_1''$ of FIG. 5B is rotated relative to the scanned area $S_1'$ of FIG. 3B (i.e., the direction of scanning of the beam on the CCD camera 13 is not coincident with the horizontal direction (x-direction) of the sensitive surface D), because the image is rotated by a variation in the magnetization of the intermediate lenses 5-8.

Figure 6A:
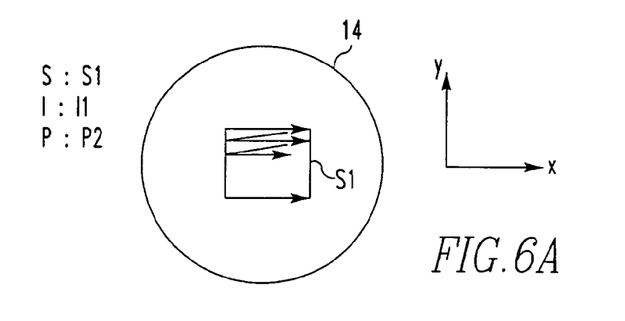
FIGS. 6A and 6B are diagrams illustrating motion of a spectrum on a CCD camera.
Figure 6B:
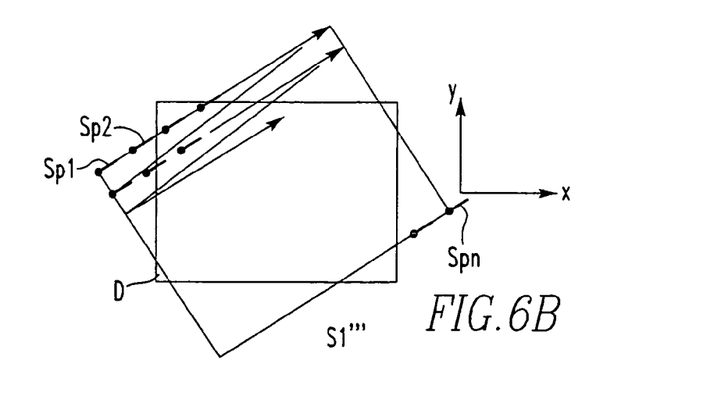

FIG. 6B shows movement of spectra ($Sp_i$, $Sp_2$, ..., $Sp_n$) on the light-sensitive surface D of the CCD camera 13 when the area S on the specimen 14 scanned with the electron beam is $S_1$ (see FIG. 6A) in the same way as in the case of FIG. 3A, the amount of excitation I of the intermediate lenses 5-8 is $I_1$ in the same way as in the case of FIG. 3A, and the amount of excitation P of the projector lenses 10, 11 is $P_2$ different from the amount of excitation in the case of FIGS. 3A-5A. This amount of excitation $P_2$ is intended to magnify the spectra as compared with the case of FIGS. 3A-5A and to project the spectra onto the CCD camera 13. Accordingly, in this case, the spectra ($Sp_1$, $Sp_2$, ..., $Sp_n$) are greater than in the case of FIGS. 3A-5A. Furthermore, the area $S_1'''$ of the CCD camera 13 scanned with the beam is wider than in the case of FIG. 3A and so the area $S_1'''$ does not fit within the light-sensitive surface D. Therefore, some spectra, such as $Sp_1$ and $Sp_2$ are not imaged by the CCD camera 13. The scanned area $S_1'''$ of FIG. 6B has rotated relative to the scanned area $S_1'$ of FIG. 3B, i.e., the direction of scanning of the beam on the CCD camera 13 does not agree with the horizontal direction (x-direction) of the light-sensitive surface D, because the image is rotated by a variation in the excitation of the projector lenses 10 and 11. This image rotation has rotated the spectra ($Sp_1$, $Sp_2$, ..., $Sp_n$) of FIG. 6B relative to the spectrum of FIG. 3B.

The case in which the deflection coil 12 for moving the spectral position is not operated in the electron microscope of FIG. 2 has been described so far. In this case, the aforementioned problem occurs. In the microscope of FIG. 2, the deflection coil 12 is operated when spectra are obtained. The operation is described below.

As mentioned previously, the scanning waveform signal A' created by the scan generator 19 is sent to the scanning direction rotating circuit 23a of the spectral position correcting signal supply circuit 23. The rotating circuit 23a is used to rotate the scanning waveform signal A' produced from the scan generator 19. The angular position is controlled by the central controller 20. That is, when the electron beam scans over the specimen 14, the rotating circuit 23a creates a beam deflection signal G for maintaining the scanning of the beam on the CCD camera 13 in the horizontal (x-direction) direction of the light-sensitive surface D at all times. In creating this signal G, the rotating circuit 23a creates the deflection signal G based on the scanning waveform signal A' and on a rotation correction signal E (S, I, P) from the central controller 20.

The rotation correction signal E (S, I, P) is described. This signal E maintains the scanning of the beam on the CCD camera 13 in the horizontal direction (x-direction) of the light-sensitive surface D at all times when the electron beam scans over the specimen 14. This correction signal E (S, I, P) is previously stored in the memory 20a of the central controller 20 for various combinations of values of the scanned area S on the specimen, the amount of excitation I of the intermediate lenses 5-8, and the amount of excitation P of the projector lenses 10, 11. That is, various sets of values of the correction signal E ($S_1$, $I_1$, $P_1$), ..., E ($S_2$, $I_1$, $P_1$), ..., E ($S_1$, $I_2$, $P_1$), ..., E ($S_1$, $I_1$, $P_2$), ... are stored in the memory 20a of the central controller 20.

The central controller 20 reads one set of values of rotation correction signal E (S, I, P) corresponding to the present scanned area S on the specimen, the present amount of excitation I of the intermediate lenses 5-8, and the present amount of excitation P of the projector lenses 10, 11 from the memory 20a in which those various sets of values of the correction signal are stored, and supplies the read set of values of the correction signal E to the rotating circuit 23a. For example, where the instrument is currently in the state shown in FIG. 5 (S=$S_1$, I=$I_2$, and P=$P_1$), the central controller 20 reads the rotation correction signal E ($S_1$, $I_2$, $P_1$) for causing the scanning of the beam on the CCD camera 13 to assume the horizontal (x-direction) direction of the light-sensitive surface D (see FIG. 7A) from the memory 20a, and supplies the signal to the scanning direction rotating circuit 23a.

The beam deflection signal G which is created by the scanning direction rotating circuit 23a to cause the scanning of the beam on the CCD camera 13 to assume the horizontal direction (x-direction) of the light-sensitive surface D at all times is sent to the scanning amplitude varying circuit 23b that permits the amplitude of the deflection signal G from the scanning direction rotating circuit 23a to be varied to an arbitrary value. The amplitude is controlled by the central controller 20. That is, the amplitude varying circuit 23b creates a spectral position correcting signal H (beam deflection signal H) for projecting the spectra ($Sp_1$, $Sp_2$, ..., $Sp_n$) at a given position (e.g., the center) of the light-sensitive surface D of the CCD camera 13 at all times when the beam scans over the specimen 14. In creating this signal H, the amplitude varying circuit 23b creates the spectral position correcting signal H based on the beam deflection signal G and on an amplitude correcting signal F (S, I, P) from the central controller 20.

The amplitude correcting signal F (S, I, P) is now described. This correcting signal F is used to project the spectra ($Sp_1$, $Sp_2$, ..., $Sp_n$) at a given position on the light-sensitive surface D of the CCD camera 13 at all times when the beam scans over the specimen 14. This signal F (S, I, P) projects the spectral position p (FIG. 1B) corresponding to the zero-loss peak $P_0$ at the center of the light-sensitive surface D at all times for the spectra $Sp_1$, $Sp_2$, ..., $Sp_n$. The amplitude correcting signal F (S, I, P) is previously stored in the memory 20b of the central controller 20 for various combinations of values of the scanned area S on the specimen, the amount of excitation I of the intermediate lenses 5-8, and the amount of excitation P of the projector lenses 10, 11. That is, various sets of values of the correcting signal F ($S_1$, $I_1$, $P_1$), ..., F ($S_2$, $I_1$, $P_1$), ..., F ($S_1$, $I_2$, $P_1$), ..., F ($S_1$, $I_1$, $P_2$), ... are stored in the memory 20b of the central controller 20.

Figure 7A:
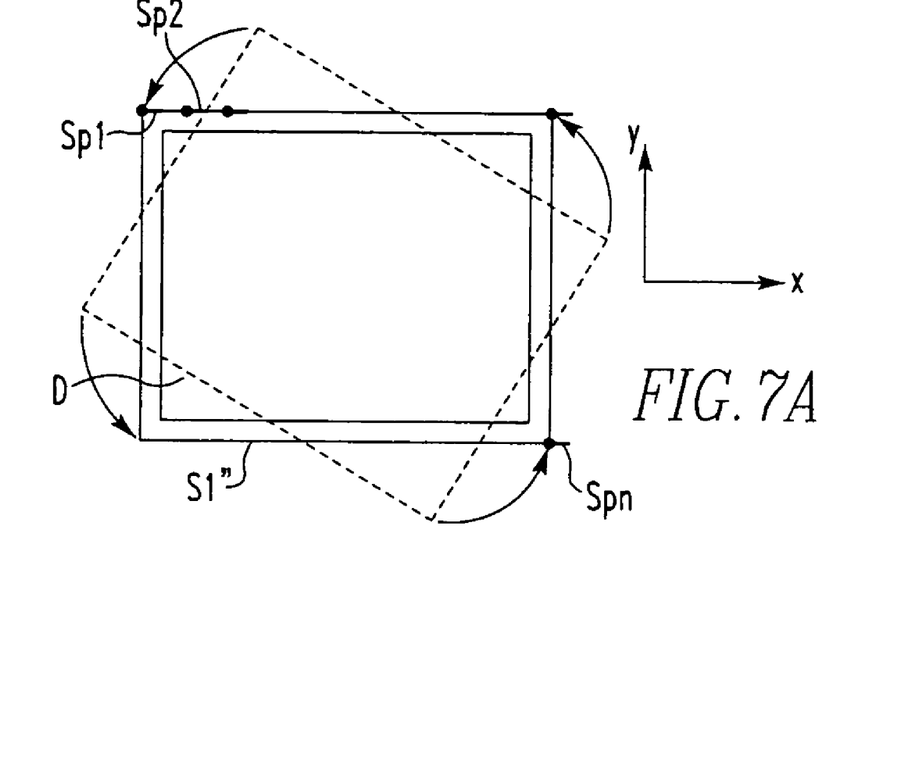
FIGS. 7A and 7B are diagrams illustrating correction of the position of a spectrum in accordance with the present invention.
Figure 7B:
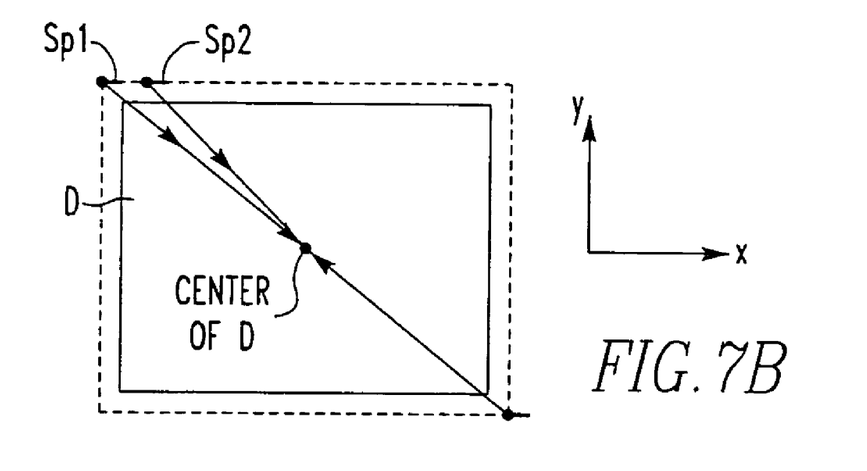

The central controller 20 reads one set of values of amplitude correcting signal F (S, I, P) corresponding to the present scanned area S on the specimen, the present amount of excitation I of the intermediate lenses 5-8, and the present amount of excitation P of the projector lenses 10, 11 from the memory 20b in which those various sets of values of the correction signal are stored, and supplies the signal F to the scanning amplitude varying circuit 23b. For example, where the instrument is currently in the state shown in FIG. 5A (S=$S_1$, I=$I_2$, and P=$P_1$) and the scanning direction rotating circuit 23a is creating a rotation-correcting beam deflection signal as shown in FIG. 7A, the central controller 20 reads the amplitude correcting signal F ($S_1$, $I_2$, $P_1$) for projecting the spectra ($Sp_1$, $Sp_2$, ..., $Sp_n$) located at the position of FIG. 7A at the center of the light-sensitive surface D of the CCD camera 13 (see FIG. 7B) from the memory 20b, and supplies the signal to the scanning amplitude varying circuit 23b.

The spectral position correcting signal H which is created by the scanning amplitude varying circuit 23b to project the spectra ($Sp_1$, $Sp_2$, ..., $Sp_n$) at the center of the light-sensitive surface D of the CCD camera 13 is supplied to the driver amplifier 18. As is obvious from the foregoing description, the correcting signal H corresponds to the beam deflecting signal A' supplied to the driver amplifier 15 from the scan generator 19, the excitation signal B' supplied to the driver amplifier 16 from the intermediate lens excitation signal supply circuit 21, and the excitation signal C' supplied to the driver amplifier 17 from the projector lens excitation signal supply circuit 22.

The driver amplifier 18 controls the electrical current flowing through the spectral position moving deflection coil 12, based on the spectral position correcting signal H. As a result, the electron beam passed through the projector lens 11 is deflected by the deflection coil 12 for moving the spectral position, so that the spectra ($Sp_1$, $Sp_2$, ..., $Sp_n$) are projected at the center of the light-sensitive surface D of the CCD camera 13.

The spectra ($Sp_1$, $Sp_2$, ..., $Sp_n$) projected at the center of the light-sensitive surface D are successively accepted into the CCD camera 13 and sent to the image processor 24, which processes the incoming spectral images ($Sp_1$, $Sp_2$, ..., $Sp_n$) and converts each spectral image into an EELS profile as shown in FIG. 1A. The image processor 24 then displays the profiles onto a CRT (not shown).

The operation of the electron microscope shown in FIG. 2 has been described so far. As described previously, spectra are always projected at a given position (the center in the above-described embodiment) on the CCD camera 13 irrespective of the scanning of the beam over the specimen in the microscope shown in FIG. 2. Furthermore, if the amounts of excitation of the intermediate lenses 5-8 and projector lenses 10, 11 are varied during scanning, the spectra are projected at a given position on the CCD camera 13 at all times. Therefore, EELS profiles can be reliably obtained regardless of variations in the electron beam position on the specimen and variations in the excitations of the lenses.

Furthermore, in the electron microscope of FIG. 2, spectra are always projected at a given position (center) of the CCD camera and so the positions of the spectra within the spectral images accepted by the CCD camera are constant. Therefore, if the image position (position p in FIG. 1B) corresponding to the zero-loss peak $P_0$ is detected by an image recognition technique, the detection can be achieved by searching only a central portion of each spectral image. The direction of energy dispersion in EELS profiles can be calibrated in a short time. Accordingly, EELS profiles can be quickly obtained in the present invention.

It is to be understood that the present invention is not limited to the above-described embodiment. For example, the central controller 20 can know the present electron beam position (coordinates in the horizontal and vertical directions) on the specimen because the scan generator 19 is controlled by the central controller 20. Accordingly, the central controller 20 may computationally find a signal corresponding to the output signals from the scanning direction rotating circuit 23a and scanning amplitude varying circuit 23b and supply the found signal (i.e., the spectral position correcting signal H) to the driver amplifier 18.

In addition, in the above-described embodiment, the spectral position correcting signal H is supplied to the deflection coil 12 for moving the spectral position. Instead, the correcting signal H may be supplied to a projector lens deflection coil normally mounted between the projector lenses 10 and 11.

Further, instead of disposing the deflection coil 12 for moving the spectral position, two stages of beam deflection coils (second deflector) may be positioned, for example, between the rear focal plane h and the intermediate lens 5. The electron beam placed off the optical axis O by scanning of the beam over the specimen 14 may be returned to the axis O by the two stages of beam deflection coils. Where this method is adopted, if the beam is scanned over the specimen, the incident crossover point i does not move in the x- or y-direction. Consequently, spectra are always projected onto the CCD camera irrespective of the scanning of the beam over the specimen.

Having thus described my invention with the detail and particularity required by the Patent Laws, what is desired protected by Letters Patent is set forth in the following claims.

The invention claimed is:

1. An electron microscope comprising:
    an electron gun for emitting an electron beam;
    a condenser lens for focusing the beam onto a specimen;
    first deflection means for deflecting the beam hitting the specimen to vary electron beam position on the specimen;
    an energy filter for energy-dispersing the electron beam ejected from the specimen in a given direction to form a spectrum;
    a projector lens for projecting the spectrum formed by the filter onto an image detector;
    second deflection means for deflecting the beam ejected from the specimen in such a way that the spectrum is projected onto the detector irrespective of the electron beam position on the specimen
    said first deflection means has a first deflector disposed between the electron gun and the specimen and a deflection signal supply circuit for supplying a beam deflection signal to a power supply that drives the first deflector;
    said second deflection means has a second deflector disposed between the specimen and the image detector and a spectral position correcting signal supply circuit for supplying a spectral position correcting signal to a power supply that drives the second deflector;
    said spectral position correcting signal supply circuit for producing a spectral position correcting signal corresponding to said beam deflection signal; and
    said spectral position correcting signal supply circuit having a scanning direction rotating circuit for rotating said beam deflection signal and a scanning amplitude varying circuit for varying the amplitude of the beam deflection signal rotated by the scanning direction rotating circuit.

2. An electron microscope as set forth in claim 1, wherein said second deflection means deflects the electron beam ejected from the specimen such that said spectrum is projected at a given position on said image detector irrespective of the electron beam position on the specimen.

3. An electron microscope as set forth in claim 1, wherein said second deflector is disposed between the energy filter and the image detector.

4. An electron microscope as set forth in claim 3, further including:
    multiple stages of electron lenses disposed between said specimen and the energy filter; and
    an excitation signal supply circuit for supplying an excitation signal to a power supply that drives the electron lenses,
    wherein said spectral position correcting signal supply circuit produces a spectral position correcting signal corresponding to said beam deflection signal and said excitation signal.

5. An electron microscope as set forth in claim 1, wherein said second deflector is disposed between the projector lens and the image detector, and wherein said spectral position correcting signal supply circuit produces a spectral position correcting signal corresponding to the excitation signal supplied to a power supply that drives said projector lens.

6. An electron microscope as set forth in claim 4, wherein said second deflector is disposed between the projector lens and the image detector, and wherein said spectral position correcting signal supply circuit produces a spectral position correcting signal corresponding to the excitation signal supplied to a power supply that drives said projector lens.

7. An electron microscope as set forth in claim 1, wherein said second deflector is disposed between the specimen and the energy filter.

8. An electron microscope as set forth in claim 1, further including means for creating an EELS profile based on a spectral image taken in by said image detector.

* * * * *